(12) United States Patent
Frijlink

(10) Patent No.: US 6,899,764 B2
(45) Date of Patent: May 31, 2005

(54) CHEMICAL VAPOR DEPOSITION REACTOR AND PROCESS CHAMBER FOR SAID REACTOR

(75) Inventor: Peter Frijlink, Yerres (FR)

(73) Assignee: Aixtron AG (DE)

( * ) Notice: Subject to any disclaimer, the term of this patent is extended or adjusted under 35 U.S.C. 154(b) by 0 days.

(21) Appl. No.: 10/174,667

(22) Filed: Jun. 19, 2002

(65) Prior Publication Data

US 2004/0200412 A1 Oct. 14, 2004

Related U.S. Application Data

(63) Continuation of application No. PCT/EP00/11992, filed on Nov. 30, 2000.

(30) Foreign Application Priority Data

Dec. 22, 1999 (EP) .............................. 99403255

(51) Int. Cl.$^7$ ............................ C23C 16/00; C23F 1/00; H01L 21/306
(52) U.S. Cl. ...................... 118/719; 118/715; 118/733; 156/345.33; 156/345.34
(58) Field of Search ............................ 118/715, 719, 118/730, 733; 156/345.33, 345.34, 345.1

(56) References Cited

U.S. PATENT DOCUMENTS 4,450,786 A 5/1984 Doehler et al. ............. 118/719
4,961,399 A * 10/1990 Frijlink ...................... 118/730
4,976,217 A * 12/1990 Frijlink ...................... 118/733
5,788,777 A * 8/1998 Burk, Jr. ..................... 118/730
6,342,691 B1 * 1/2002 Johnsgard et al. .......... 219/390

FOREIGN PATENT DOCUMENTS

WO WO 99/42636 8/1999

* cited by examiner

*Primary Examiner*—Parviz Hassanzadeh
*Assistant Examiner*—Karla Moore
(74) *Attorney, Agent, or Firm*—St. Onge Steward Johnston & Reens LLC

(57) ABSTRACT

A chemical vapor deposition reactor having a process chamber accommodating a substrate holder for wafers, a first gas flow of reactive gases to process the wafers and a crown-shaped gas-collector surrounding the substrate-holder, wherein said reactor further comprises: a base plate and a cover plate disposed respectively beneath and above the substrate-holder, an outer ring surrounding the gas-collector and touching both the base plate and the cover-plate, and a second flow of non-reactive gases propagating in spaces outside the process chamber limited by the base and cover plates and the outer ring, and said second flow acting as a counter-flow for preventing the first reactive gas flow to exit from the process chamber but through the gas-collector.

14 Claims, 5 Drawing Sheets

CHEMICAL VAPOR DEPOSITION REACTOR AND PROCESS CHAMBER FOR SAID REACTOR

This application is a continuation of pending International Application No. PCT/EP00/11992 filed Nov. 30, 2000, which designates the United States and claims priority of European Application No. 99403255.5 filed Dec. 22, 1999.

FIELD OF THE INVENTION

The invention relates to a chemical vapor deposition reactor comprising a process chamber containing wafers and flowing reactive gases to process said wafers and comprising means to prevent the reactive gases from exiting said process chamber but through a gas-collector.

The invention finds an application in the industry of manufacturing chemical vapor deposition reactors for processing semiconductor devices, for example, gallium arsenide semiconductor devices.

BACKGROUND OF THE INVENTION

A chemical vapor deposition reactor is already known from the patent U.S. Pat. No. 4,961,399. This document describes an epitaxial reactor for processing a plurality of semiconductor wafers by exposing them to a reactive gas flow. Said reactor has a planetary graphite substrate holder in a process chamber, which is the space where the gas flow is in contact with the wafers and is constituted by a cylindrical body, having a vertical axis and surrounding the planetary substrate holder as closely as possible. The cylindrical body is hermetically sealed at its lower and upper parts by bottom and top plates. A roughly flat cover covers this arrangement. An inlet for the reactive gas flow is located in the center of the cover, opposite to the planetary substrate holder. This inlet introduces the reactive gas flow into the process chamber via several concentric funnels whose ends flare downwardly. For opening the reactor, the cover is lifted to allow access to the interior of the process chamber. The substrate holder is surrounded by a hollow quartz ring provided with apertures around its circumference, which is an exhaust arrangement in which tubes end, via which the reactive gas flow can exit. An additional gas flow formed of hydrogen is fed in the space disposed between the cylindrical body and the quartz ring, in order to prevent the reactive gas flow to penetrate and contaminate said space.

In the field of manufacturing semiconductor devices including depositing epitaxial layers on semiconductor material of the III–V chemical group, the above described reactor does not solve a certain number of problems.

SUMMARY OF THE INVENTION

A problem is that the process chamber is not provided with sufficient means of isolation from peripheral spaces of the reactor. Said process chamber must be isolated in order to prevent the reactive gases flowing in said process chamber from exiting the process chamber and flowing towards spaces of said reactor other than said process chamber, contaminating said other spaces. As a matter of fact, the chemical reaction performed using reactive gas at high temperature leads to the creation of deposits, which are desirable on the wafers, but not desirable on all of the other spaces of the reactor. To avoid loss of function of those spaces, or change of epitaxial growth conditions, or deposit of foreign particles on the wafers during the action of loading/unloading said wafers by the accumulation of foreign deposits, those spaces have to be frequently cleaned. As a matter of fact, the actions to clean or replace said spaces create loss of useful time for the reactor. The contamination of spaces gets particularly important when the spaces exposed to the previously heated reactive gases are cool. For example, in the case of III–V compounds involving arsenic, the arsenic deposits on all surfaces below about 200° C. In large reactors, the outer wall of the process chamber has to be cooled for many practical reasons, and its size and weight and the multiplicity of connections to it make that said chamber is not routinely easily opened for cleaning.

This process chamber must also be isolated from the other reactor spaces in order to allow that the gas mixture composed of precursor gases to which the wafers are exposed can be changed very quickly as may be required by the process. Practically, after stopping the introduction of a precursor gas into the process chamber through the central inlet, the precursor gas concentration over the wafers should decrease by a factor 10000 in a few seconds. This is required, for example, when N-doping precursors are used during the growth of double doped structures such as High Electron Mobility Transistors denoted HEMT. This requirement can only be met if the reactive gases remain confined into the space facing the wafers. All spaces other than that space should be exempt of reactive gases. Said process chamber must also be isolated because, in chemical vapor deposition process, the reactive gases used are usually dangerous and polluting and may not be allowed to flow outside the process chamber but through the plenum exhaust.

Particular difficulties for isolating the process chamber are related to the substrate holder. First, said substrate holder is heated to temperatures in a range of 300° C. to 1500° C. to enable the chemical reaction. So, it is mainly made of a material both adapted to accommodate the wafers and to withstand such high temperatures, mainly graphic that presents the inconvenient to be porous. Second, said substrate holder is rotating in order to ensure the wafers to be uniform between each others, and, also in order to influence the gas flow dynamics. The connection between a rotative axis and static parts is not easily tight and might form an exhaust for the reactive gas flow. So, the process chamber is not easily hermetically sealed from the space beneath the substrate holder.

Other particular difficulties for isolating the process chamber lie in the fact that the volume of the spaces outside the process chamber can happen to be considerably larger than the space directly facing the wafers. Thus, an additional flow of hydrogen as known of the cited US patent should reach a considerable size for constituting an actual counter-flow ensuring that those spaces remain free of reactive gases. If the size of such a counter-flow, which is determined by the reactor design, happened to get larger than the amount of total flow in the useful space directly facing the wafers, several negative consequences would arise, such as degradation of the epitaxial layer uniformity, degradation of layer purity, excessive consumption of ultra pure gases.

Other particular difficulties for isolating the process chamber lie in the fact that said process chamber is of relatively great dimension in order to accommodate several wafers at the same time. So, certain elements of said large process chamber, which are located in high temperature areas, must be movable with respect to other elements, for example, for opening/closing the process chamber when introducing the wafers or cleaning. Thus, it is not possible to make use of standards seals to seal movable elements in such high temperature areas. Also, due to the great dimension of the process chamber, and in view of opening/closing the process chamber, dosing surfaces of movable elements are not allowed to be simply set in contact upon one another, because a sufficient degree of flatness of these large-dimensioned dosing surfaces is not possibly mechanically obtained and would result in irregular closing interface. As a result, closing the process chamber by simple contact of opposite closing surfaces, without sealing means, would let the flowing reactive gases exit through the irregular closing interface, or let an inefficient counter-flow penetrate through said irregular interface.

It is a purpose of the invention to solve the problem of preventing the process gases to exit the process chamber. This problem is solved by a chemical vapor deposition reactor comprising a process chamber containing wafers and flowing reactive gases to process said wafers and comprising means for isolating said process chamber as claimed in claim 1.

An other problem is that the gas pressure inside the process chamber is not allowed to be substantially different from the atmospheric pressure value. So, the inert gas for forming a counter-flow is to be introduced in a way that does not disturb the process pressure value, i.e. the amount of inert gas for forming an effective counter-flow is not allowed to be too important whichever the peripheral length of the movable elements of the process chamber. Too great an amount of inert gas to prevent the flowing reactive process gases from exiting the reactor chamber, might mix with, and dilute said gases, and might disturb the process performed inside the process chamber. So, due to the fact that the inert gas is not allowed to disturb the process, it must be introduced in an other area than the process gases because the odds that it mixes with the process gases are too important.

It is a further purpose of the invention to propose means for keeping the size of a counter-flow to a minimum in a reactor.

Other embodiments of the chemical vapor deposition reactor are claimed in dependant-claims to solve the other above-exposed problems.

Advantages of the invention are that these means are easier to manufacture and to use, and are more efficient that the means already known of the state of the art: the layers deposited on the wafers are more uniform; the spaces external to the deposit chambers are kept dean; the volume of counter-flow gas is kept as small as possible; the pressure inside the deposit chamber is easily maintained at a required level.

BRIEF DESCRIPTION OF THE DRAWINGS

The object of the invention is described in detail hereafter in reference to the following diagrammatic figures among which.

DESCRIPTION OF THE PREFERRED EMBODIMENTS

Figure 1:
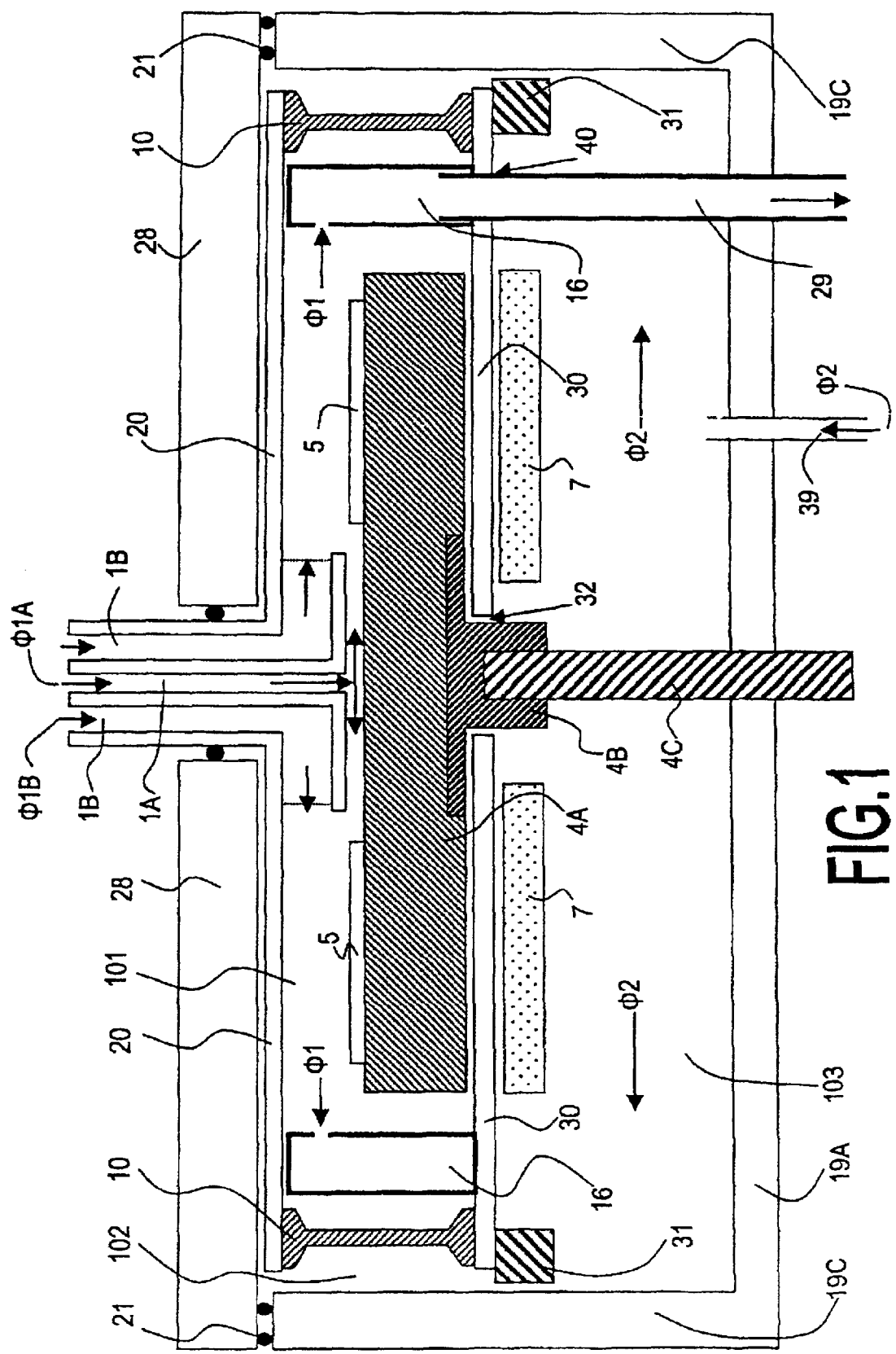
FIG. 1 is a cross-sectional view of a cylindrical chemical deposition reactor.

The invention relates to a chemical vapor deposition chamber referred to as process chamber for accommodating for example several semiconductor wafers. The invention also relates to a chemical vapor deposition reactor having such a process chamber. The process chamber has isolation elements to prevent the reactive gases present in the process chamber to exit said process chamber and flow towards the other parts of said reactor. The process chamber also has movable elements for opening/closing operation. The isolation elements and the movable element are provided with specific high temperature seal means structures and with a specific counter-flow to achieve the isolation of the process chamber. By high temperatures, it is to be understood temperatures of the order of, or higher than, 300° C., for example in the range of 300 to 1500° C. The invention finds an application for example in the industry of manufacturing gallium arsenide semiconductor devices.

Referring to FIG. 1 to FIG. 4, a reactor is roughly cylindrical having a vertical axis. The reactor is provided with a circular base plate 30, for example having a diameter of about 25 cm, which in turn supports a rotating substrate holder 4A, 4B, on which one or several semiconductor wafers 5 are placed. The substrate holder has a rotating axis 4C passing through an opening 32 of the base plate 30. Heating means 7, as known of those skilled in the art, are disposed beneath the base plate 30 to heat the substrate holder 4A. The substrate holder is made of an appropriate material to accommodate the wafers and to be resilient to the process temperature, preferably graphite. However the graphite has the inconvenient to be porous and might let the reactive gases exit from the process chamber.

This base plate 30 is arranged within the reactor in such a way that the reactive gases are in contact with the wafers. The reactor comprises a cylindrical body 19C having a vertical axis, which surrounds the base plate 30. On the lower and upper parts of said cylindrical body 19C are placed a bottom plate 19A and a roughly flat cover 28, respectively. The cylindrical body 19C being in a cold area of the reactor, the tightness with the bottom plate 19A and the cover 28 is ensured by toric joints 21, the bottom plate being preferably an horizontal part 19A of the cylindrical body 19C. The cover 28 can be lifted to place the base plate 30. It is practically parallel to the base plate during the process operation, in which reactive gases are introduced into the reactor through concentric funnels forming an inlet 1A for a first precursor of reactive gas flow $\Phi 1A$ and an inlet 1B for a second precursor of reactive gas flow $\Phi 1B$. The gas flows move radially above the base plate 30 towards the periphery of said base plate. The reactive process gases are collected by a gas-collector 16 through outlets 12, and by a gas plenum 29 connected to the gas-collector 16 at an exhaust port 40. The gas-collector 16 is disposed on the edge of the base plate 30, which base plate is positioned unto a ring 31.

Figures 5A, 5B:
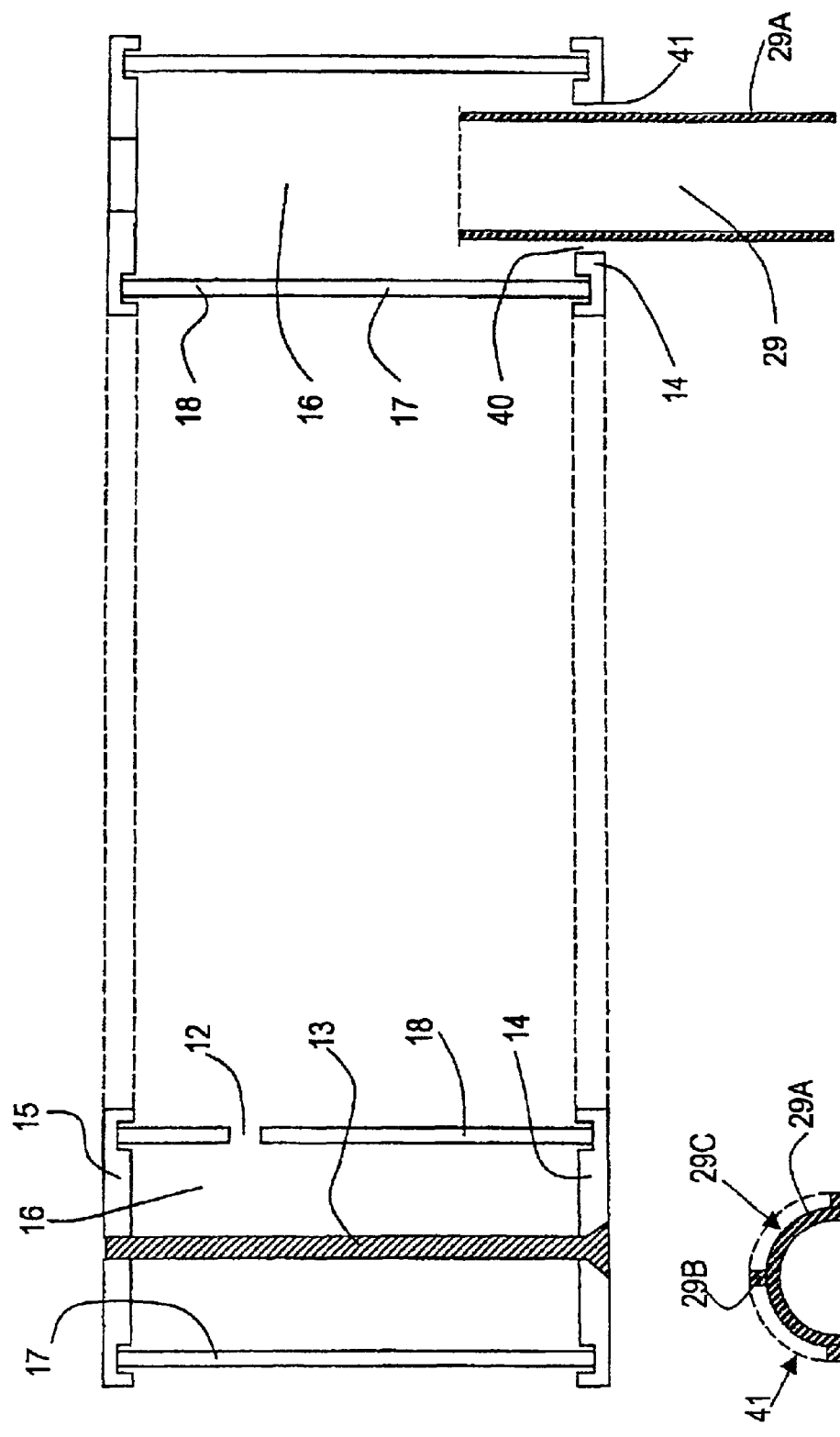
FIG. 5A is an enlarged view of the crown-shaped exhaust and the FIG. 5B shows the exhaust port.

Said gas-collector is described in detail in reference to FIG. 5A. This gas-collector is crown-shaped and comprises an annular top part 15, and an annular low part 14, said top and low parts being connected by lateral flanges 17 and 18. Screws 13 regularly spaced hold the top part 15 and the low part 14 together with the flanges 17, 18. The processing chamber 101 is limited by the flange 18 of the crown-shaped gas-collector 16. The flange 18 surrounding the substrate holder 4A has apertures 12 regularly spaced to let the reactive gases exhaust from the process chamber 101 and be lead by the gas-collector 16 towards a gas plenum 29. Referring to FIG. 5B, the gas plenum 29 is a tube having a wall 29A, which is provided with external longitudinal ridges 29B. The gas plenum 29 slides into an aperture 40 of the annular low part 14, leaving small apertures 29C between the internal part 41 of the aperture 40 and the wall 29A of the gas plenum tube. The metal for forming the gas-collector may be favorably molybdenum. This gas-collector made of molybdenum presents the advantages of not involving the risk of exerting excessive forces onto the cover plate and base plate, of supporting the temperature prevailing in the chamber at the level of the semiconductor wafers and of being resistant to the processing gases use. Preferably, two tubes 29 arranged diametrically opposite to each other merge into the interior of the gas-collector 16 to discharge the gases to the exterior.

In the example of embodiment illustrated by FIG. 1, the inlet tube 1b has an extension 20 that is bound to the cover 28, so that the inlet tubes 1A, 1B are lifted together with the cover 28 during an opening/closing operation of the reactor and so that this extension 20 forms the actual cover, hereafter referred to as cover plate 20, for the space immediately above the wafers 5 and substrate holder 4A. Preferably the base plate 30, cover plate 20 and inlets 1A, 1B are made of quartz that is a non-porous material resilient to the high temperatures of the process.

According to the invention, isolation means prevent the reactive gases from flowing into spaces of the reactor other than the space immediately above the substrate holder and the wafers, referred to as first space 101, and hereafter denoted process chamber, in fact containing the substrate holder 4A with the wafers 5, the inlets 1A, 1B and the gas-collector 16. Said isolation means comprise in detail:

A cylindrical isolation element referred to as outer ring 10. Said outer ring 10 surrounds the gas-collector 16 and the substrate holder 4A with the wafers 5 and touches both the base plate 30 and the cover plate 20, in such a manner that the first space denoted process chamber 101 containing the process gases is isolated from a second space 102 and third space 103 disposed externally to the outer ring 10 and plates 30 and 20, within the peripheral wall 19C, 19A. The outer ring 10 is disposed on the edge of the base plate 30, and has upper and lower flat surfaces for touching the base plate 30 and the extension cover 20. This outer ring 10 is preferably made of inox.

It is to be noted that the gas-collector 16 is not necessarily part of the isolating elements. It stands on the edge of the base plate 30 in such a way that it does not touch the cover plate 20 for allowing dilations due the high temperature gases collected.

A non-porous annular element 4B bonded to the porous substrate holder 4A and to the rotating axis 4C. Said annular non-porous element 4B has an outer diameter that is greater than the diameter of the opening 32 for the rotating axis 4C, in order to prevent the reactive gases to exit through said opening 32. As a matter of fact, the base plate 30 is heated by the heating elements 7 at a temperature above 300° C., so the element 4B is constituted of a refractory metal apt to admit such temperatures. The non-porous element 4B of the substrate holder 4A is associated to the base plate 30 to particularly isolate the process chamber 101 from the third space 103.

A counter-flow Φ2 of non-reactive gas is applied in areas far from the reactive gases i.e. is introduced in the peripheral third space 103 through an inlet 39. This counter-flow propagates in the space 102 and is applied to the process chamber in a direction opposite to the reactive gases by way of specific structures referred to as high temperature seal means.

Said seal means are small grooves or roughened zones of surfaces of the interfaces of the isolation elements above-described. In the embodiment of FIG. 1, the seal means structures are applied to the flat contact surfaces of the outer ring 10 at the interfaces with the cover plate 20 and the base plate 30. The seal means structures according to the invention avoid the processing gases from exiting through said interfaces, and force said process gases through the outlets 12 and then through the exhaust plenum 29. These seal means do not allow those process gases to enter the spaces 102, 103. The seal means are described in detail hereafter.

Considering an interface I between for instance the upper surface of the outer ring 10 and the cover plate 20, it is to be noted that the process gases, located in the first space 101 of the process chamber, form a gas flow Φ1 that has a pressure P1 slightly above the external atmospheric pressure, which results in that said gas flow Φ1 propagates in a first direction D1 and tends to exit from the process chamber 101 through said interface I. The seal means structures according to the invention first comprises the application of the counter-flow denoted Φ2 of inert gas that is introduced for instance by an inlet 39 into the second and third spaces 102, 103, around the outer ring 10, that has a pressure P2 slightly above the pressure P1, which results in that said gas flow Φ2 propagates in a second opposite direction D2 and tends to enter the process chamber 101 through said interface I. The counter-flow Φ2 of inert gas propagates through the interface I as a laminar flow with a parabolic speed profile. According to the parabolic flow propagation, the laminar flow speed V2 of the counter-flow is maximum in the middle of the small height of the interface I, while said laminar flow speed V2 is near zero along the so-called contact surfaces of the interface I. In that way, the first flow Φ1 that has an inferior pressure P1, is not allowed to exit the process chamber 101 through the interface I. It is known of those skilled in the art that the propagation of laminar gas flow is related to the height H of the interface I, and to the difference of pressure between the flow and the counter-flow and also that the speed V2 of the counter-flow Φ2 is function of this height H. Thus, a necessary speed V2 to make the counter-flow efficient implies that the difference of pressure between the flow and counter-flow or the squared height $H^2$ of the interface is not too small. It has been previously explained that the pressure difference P2−P1 is not allowed to be great in order not to disturb the deposition process. Now, it is also important that the height H of the interface be not too large in order not to use a great amount of inert gas, which may also disturb the deposition process. As a matter of fact, it must be taken into account that the peripheral length of the processing chamber is important for accommodating several wafers, so that the amount of inert gas entering through the interface I may happen to be too great.

In order to provide a solution to all those problems, the seal means structures according to the invention comprises the formation, on at least one of the two opposite contact surfaces, of a set of substantially radial grooves, performed along a length at least equal to the radial dimension of the upper and lower surfaces of the outer ring, for the counter-flow Φ2 to enter the chamber 101 through said grooves. Now, the depth and the width of a groove, and the width between two adjacent grooves, are to be determined with respect to the length of the outer ring 10 in order to reach the aims of the invention. To that end, simulations are performed by calculation means of a standard kind according to known standard methods of calculation, which permit of determining those proper values. Instead of grooves, roughened zones of the contact surfaces of the considered interface may be used. Thus, the functions of the outer ring is to both to constitute an isolating element and to comprise seal means structures allowing the entry of an appropriate counter-flow Φ2.

The counter-flow Φ2 propagates substantially through the grooves in the direction D2, i.e. from the space 102 towards the inside of the processing chamber 101. The gas flow Φ1, which cannot propagate through the grooves due to the value of the counter-flow Φ2, may however propagate between the grooves, through the still existing interface I. If the width between grooves is too important, said flow Φ1 may propagate through the whole length of the interface I from the chamber 101 until it reaches the space 102, which is inconvenient. It why all the parameters of propagation of the counter-flow Φ2 and flow Φ1 are carefully calculated as above-described. When the appropriate ratio of the widths of the grooves and between the grooves is achieved, taking into account the length of the grooves, then, the gas flow Φ1 is no more allowed to exit the chamber 101 through the interface I, because, due to said appropriate ratio, the gas flow Φ1 cannot get throughout the whole length of the grooves.

Referring to FIG. 1, the counter-flow Φ2 is introduced by the inlet 39. It is shown that both the flow Φ1 and the counter-flow Φ2 are collected by the outlets 12, and then by the exhaust plenum 29. So, the gas flow Φ1 exits through the gas-collector 16, being not allowed to get through the interface I and the counter-flow Φ2 does not disturb the process.

Preferably, in a reactor having a process chamber 101 and spaces 102, 103 surrounding the outer ring 10, the pressure difference P2–P1 is about $10^{-5}$ to $10^3$ mbars, which is considered a small difference of pressure; the height H of the interface I between closing surfaces is about 0 to 1 mm, preferably 0.05 to 0.1 mm, which is considered small; the width and the depth of the grooves are about 1 mm and 0.3 mm respectively; and the ratio giving the width between grooves is 5 times the width of the groove.

Figure 2:
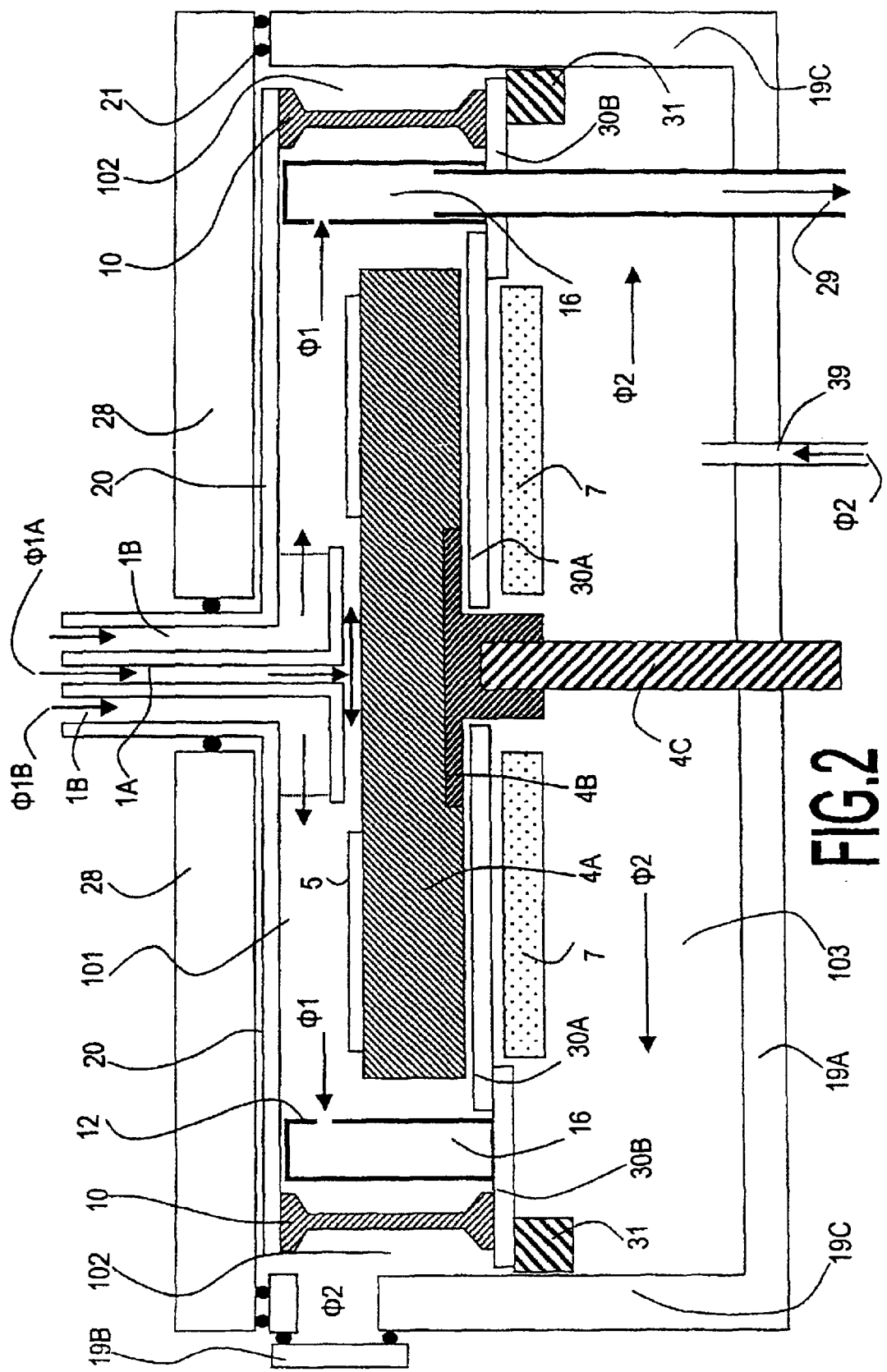
FIG. 2 is a cross-sectional view of such a reactor in an other embodiment.
Figure 3:
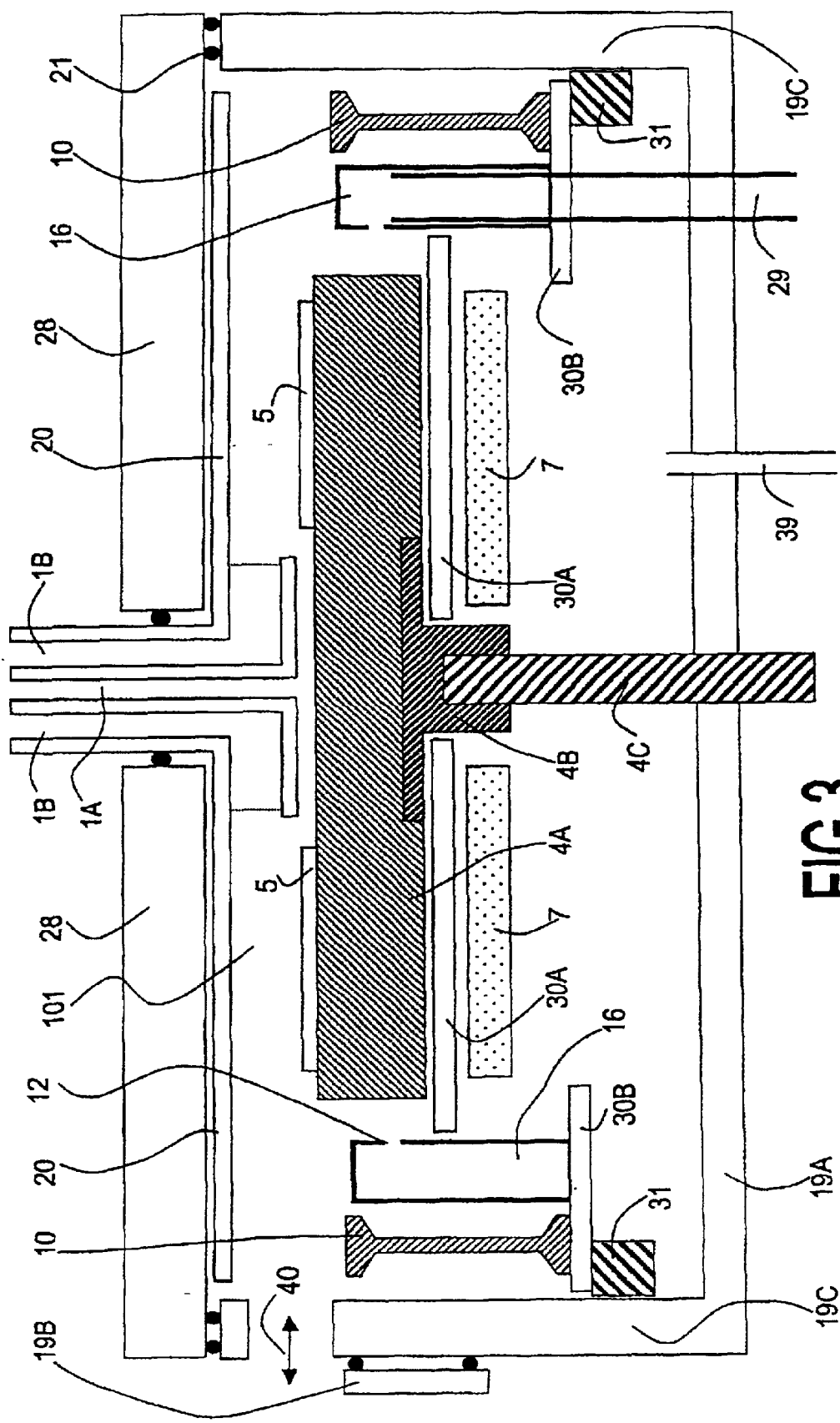
FIG. 3 is a cross-sectional view of the embodiment of FIG. 2 with aperture in position open.

Referring to FIG. 2 and FIG. 3, in an other embodiment, the reactor comprises the base plate in two parts: a first ring-shaped base plate part 30A, which is disposed beneath the substrate holder 4A, and a second ring-shaped base plate part 30B, which supports the first ring-shaped base plate part 30A, the gas-collector 16 and the outer ring 10. The second ring-shaped base plate part 30B is movable downwards with respect to the first ring-shaped base plate part 30A in order to create free access to the wafers above the outer ring and the gas-collector.

An aperture 40 is made in the peripheral wall 19C associated to a movable window 19B, referred to as gate valve, in order to create an access to the wafers when the second ring-shaped base plate part 30B is in the lowest position shown FIG. 3. For example, the arm of a robot may be used to manipulate the wafers.

The contact surfaces of the first ring-shaped base plate part 30A and the second ring-shaped base plate part 30B are provided with seal means structures as above-described.

Figure 4:
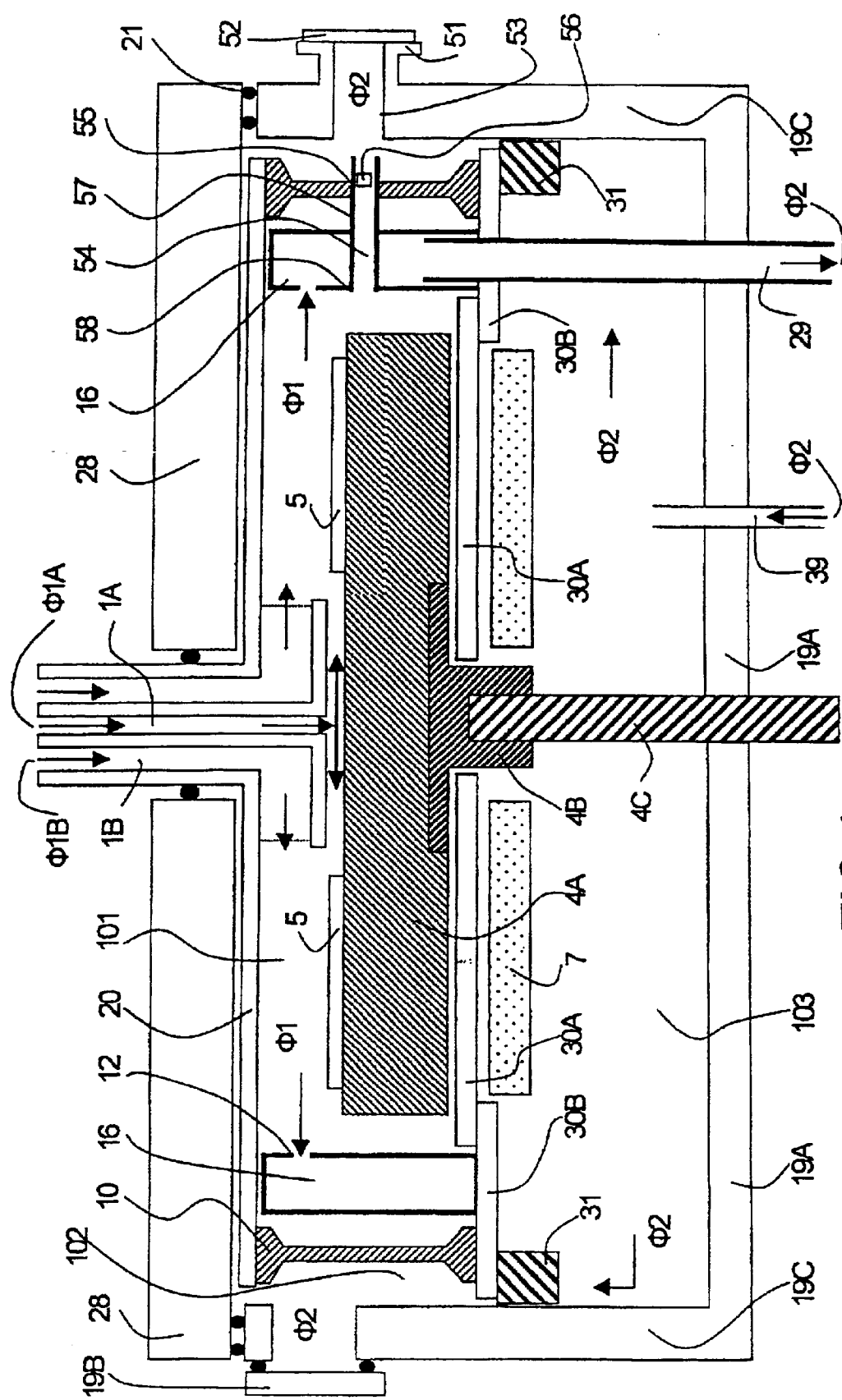
FIG. 4 is a cross-sectional view of such a reactor in an other embodiment.

Referring to FIG. 4, in an other embodiment, the reactor comprises holes 55 and 58 provided in the outer ring 10 and the gas-collector 16 respectively, in order to introduce a tube 57. Through the tube 57, a light beam is guided for permitting of examining the wafers and for example of determining their rotation speed. The light beam may be introduced through the tube 57 for instance through a window 52, transparent to said light beam, and covering an aperture 53. The transparent window 52 may be bonded to the peripheral wall 19C at a part 51. Inside the tube 57, a transparent solid material, referred to as tube window 56, is inserted so as to permit the operation of the counter-flow Φ2 created by the difference of pressures between the second space and the first space each side of said tube window.

What is claimed is:

1. A chemical vapor deposition reactor having a process chamber accommodating a substrate holder for wafers, a first inlet providing a first gas flow of reactive gases to process the wafers and a crown-shaped gas collector surrounding the substrate-holder, said gas collector forming a hollow annular space and comprises apertures to let the reactive gases exhaust from the process chamber, wherein said reactor further comprises:
   a base plate and a cover plate disposed respectively beneath and above the substrate-holder,
   an outer ring surrounding the gas-collector and touching both the base plate and the cover-plate,
   wherein the process chamber defines a first space, which first space is limited by the base and cover plates and the outer ring and an inlet for a second flow of non-reactive gases,
   characterized in that the first space is surrounded by second and third spaces limited by a substantially cylindrical peripheral wall, a lower horizontal wall and a cover, wherein one wall comprises the inlet for the second flow and that said second flow acting as a counter-flow for preventing the first reactive gas flow to exit from the process chamber but through the gas-collector.

2. A reactor as claimed in claim 1, wherein the outer ring has a top and a low flat surfaces for touching respectively the cover and the base plates, and wherein said top and low surfaces are provided with grooves or roughened zones to permit the second gas flow of acting as a counter-flow through the interfaces between the outer ring and the cover and base plates.

3. A reactor as claimed in claim 2, wherein the substrate holder is supported by a rotating axis, entering the process chamber through a hole in the base plate.

4. A reactor as claimed in claim 3, wherein said axis is connected to the substrate holder by an annular part which is larger than the hole in the base plate for the rotating axis, wherein said annular part connecting the substrate holder to the rotating axis is made of a material less porous than the substrate holder.

5. A reactor as claimed in claim 4, wherein the process temperatures are in the range of about 300 to 1500° C. and wherein said annular part connecting the substrate holder to the rotating axis is made of a material further apt to withstand such high temperatures.

6. A reactor as claimed in claim 5, wherein the base plate comprises a first internal ring-shaped base plate part disposed beneath the substrate holder and a second peripheral ring-shaped base plate part supporting the first ring-shaped base plate part, the gas-collector and the outer ring, the second ring-shaped base plate part being movable with respect to the first ring-shaped base plate part in a downward direction in order to create free access to the wafers for a manipulation operation of the wafers.

7. A reactor as claimed in claim 6, wherein the peripheral wall comprises a gate valve to create access to the wafers.

8. A reactor as claimed in claim 7, wherein the contact surfaces of the first and second ring-shaped base plate parts are provided with grooves or roughened zones to permit the second gas flow of acting as a counter-flow through the interface between said contact surfaces.

9. A reactor as claimed in claim 8, wherein a tube is inserted through holes respectively made through the outer ring and the gas-collector in order to introduce a light beam for examining the wafers on the substrate-holder.

10. A reactor as claimed in claim 9, wherein a piece of solid material, denoted tube window, transparent to the light beam, is inserted inside the tube in such a manner that the contact surfaces of the tube and tube window permit the second flow to act as a counter-flow for preventing the first reactive gas flow from exiting the process chamber.

11. A reactor as claimed in claim 10, wherein the cylindrical peripheral wall has a window transparent to the light beam to introduce said light beam through the tube.

12. A reactor as claimed in claim 11, wherein heating means are provided beneath the base plate for heating the substrate holder.

13. A reactor as claimed in claim 12, wherein the gas collector is constituted of an annular top part, an annular low part, said top and low parts being connected by lateral flanges and hold together by screws, and wherein the flange facing the substrate holder comprises outlets for the first reactive gas flow.

14. A reactor as claimed in claim 13, wherein a gas plenum for collecting the gases from the gas-collector comprises a tube sliding in holes of the gas-collector and base plate, and said tube having walls provided with ridges creating a space between the tube and the edges of the holes to permit the second gas flow of acting as a counter-flow.

* * * * *